United States Patent
Cercioglu et al.

(10) Patent No.: US 6,274,808 B1
(45) Date of Patent: Aug. 14, 2001

(54) EMI SHIELDING ENCLOSURE

(75) Inventors: Nuri Murat Cercioglu, Chatham; Behzad Davachi Mottahed, Upper Montclair; Walter J. Picot, Boonton Township, all of NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/306,443

(22) Filed: May 6, 1999

(51) Int. Cl.[7] ..................................................... H05K 9/00
(52) U.S. Cl. ............................. 174/35 GC; 174/35 R; 361/816; 361/752
(58) Field of Search ........................... 174/35 R, 35 GC; 361/816, 818, 752, 753

(56) References Cited

U.S. PATENT DOCUMENTS 5,354,951 * 10/1994 Lange, Sr. et al. ............. 174/35 R
5,436,802 * 7/1995 Trahan et al. ..................... 361/816
5,565,656 10/1996 Mottahed ......................... 174/35 GC

* cited by examiner

Primary Examiner—Dean A. Reichard
Assistant Examiner—Hung V Ngo
(74) Attorney, Agent, or Firm—Birch, Stewart, Kolasch & Birch, LLP

(57) ABSTRACT

An enclosure protects electronic equipment from physical contact and electromagnetic interference. The enclosure includes a base portion which is attachable to a circuit board and which surrounds all sides of the electronic equipment. A cover is attachable to the base in order to cover the top of the electronic equipment. The cover is attachable to the base by snap-in tangs formed on the base which cooperate with projections formed on the cover. The base is attachable to the circuit board by snap-in fasteners formed on the base. The base and the cover are made of a material which reflects and/or absorbs EMI. The EMI shielding enclosure protects the electronic equipment and allows access to the electronic equipment for replacement or repair without having to take the time to manipulate separate mechanical fasteners.

22 Claims, 17 Drawing Sheets

EMI SHIELDING ENCLOSURE

BACKGROUND OF THE INVENTION

1. Field of the Invention

The present invention relates to shielding of electromagnetic interference (EMI). More particularly, the present invention relates to a snap-in enclosure for shielding (EMI) from electronic equipment.

2. Description of Related Art

Electronic equipment is often sensitive to physical contact as well as electromagnetic fields. For example, electronic equipment which operates at a radio frequency (r.f) level is very susceptible to EMI from radio frequency fields. Accordingly, EMI sensitive electronic equipment is usually enclosed within a housing which protects the electronic equipment from physical contact and from EMI. In addition, electronic equipment which produces EMI may also be enclosed within a housing to protect adjacent EMI sensitive electronic equipment.

It is often necessary to provide enclosures on a circuit board in order to protect various pieces of electronic equipment mounted on the circuit board. Enclosures of this type are usually made of a material which either reflects or absorbs electromagnetic radiation. These housings usually include some type of a mechanical fastener for opening and closing the housing to gain access to the electronic equipment inside. Mechanical fasteners such as threaded fasteners provide a sufficient connection between parts; however, access to the electronic equipment is very time consuming which increases the cost of repair. The threaded fasteners must be detached and then reattached once repairs are completed.

Accordingly, there is a need for an enclosure which protects electronic equipment from EMI and which allows quick access to the electronic equipment without having to detach numerous mechanical fasteners.

SUMMARY OF THE INVENTION

It is an object of the present invention to provide an alternative technique for shielding electronic equipment from EMI which makes up for the above-mentioned deficiencies.

It is another object of the present invention to decrease the time required to gain access to the electronic equipment in order to decrease the cost of electronic equipment manufacture, repair and testing.

It is yet another object of the present invention to provide an enclosure which can be made in small and large sizes and in various shapes to accommodate numerous applications.

These and other objects of the present invention are fulfilled by providing an enclosure for protecting electronic equipment from electromagnetic interference comprising a base made of an EMI absorbing or reflecting material which includes a plurality of fastening elements and at least one securing element formed thereon. Furthermore, a cover made of an EMI absorbing or reflecting material includes at least one securing element formed thereon for engaging with the securing element on the base.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Figure 1:
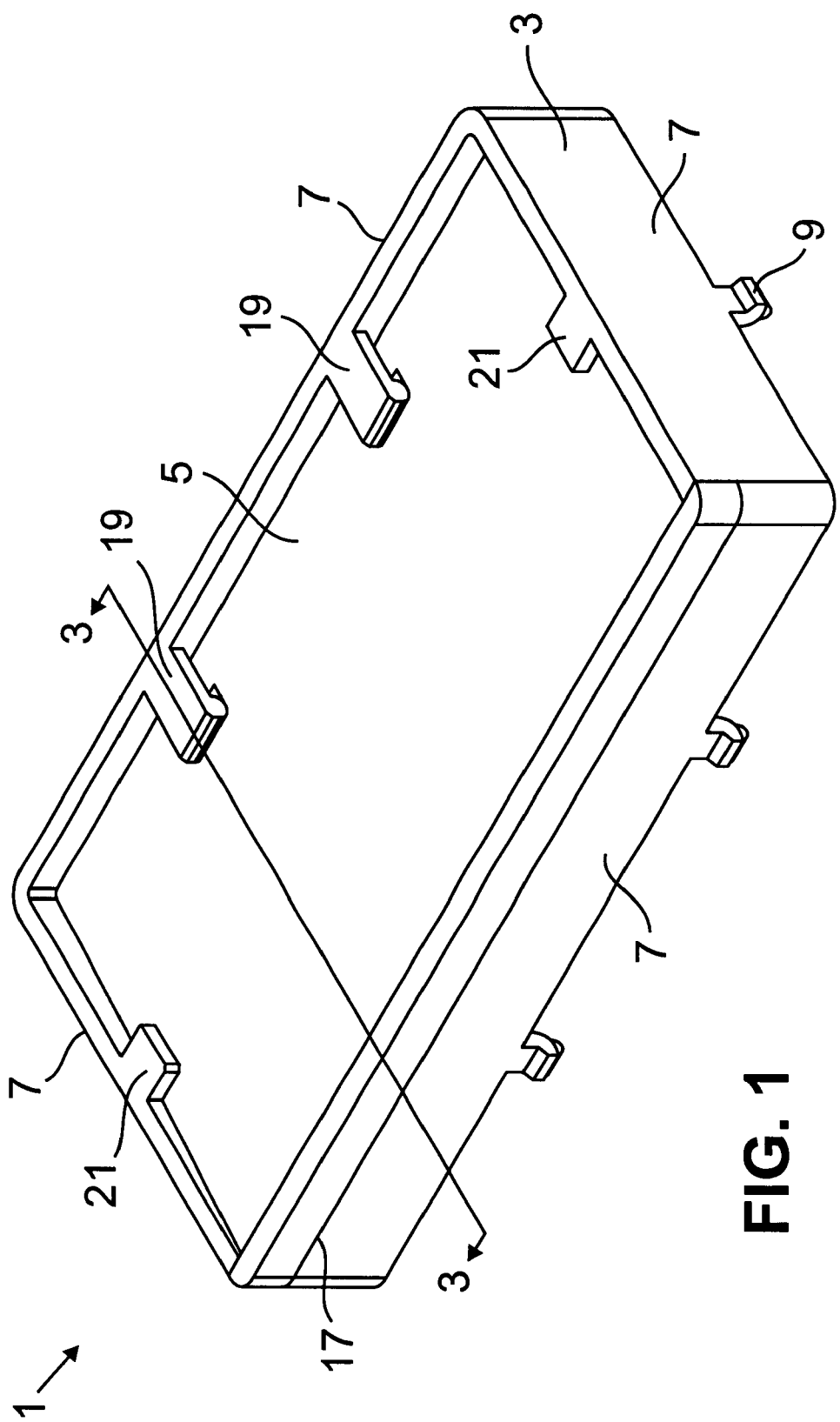
FIG. 1 is a perspective view of an EMI shielding enclosure according to a first embodiment of the present invention.

The present invention will now be described with reference to the accompanying drawings. It is noted that the same reference numerals are used to indicate the same or similar elements throughout the several views.

Referring in detail to FIGS. 1–5, an EMI shielding enclosure 1 according to a first embodiment of the present invention includes a base 3 and a cover 5. The base 3 includes a plurality of side walls 7 connected to each other end-to-end and forming a space therebetween.

Figure 2:
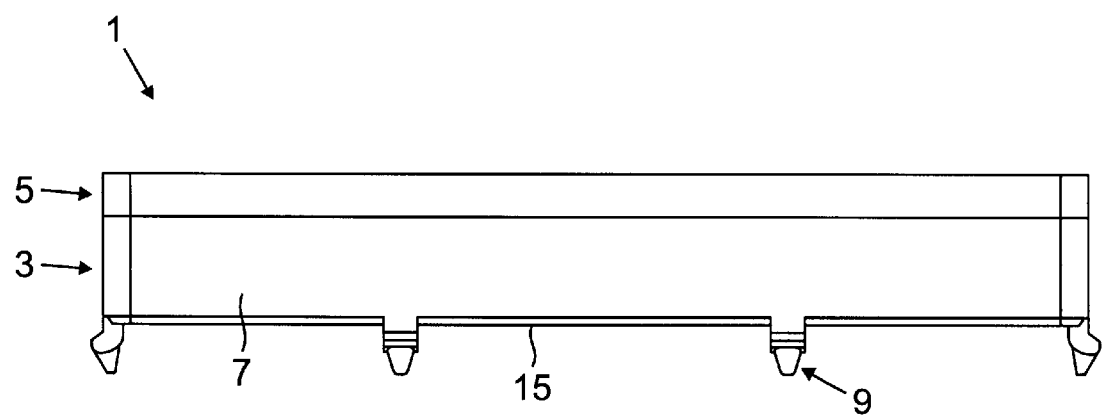
FIG. 2 is a left side elevational view of the enclosure of FIG. 1.
Figure 3:
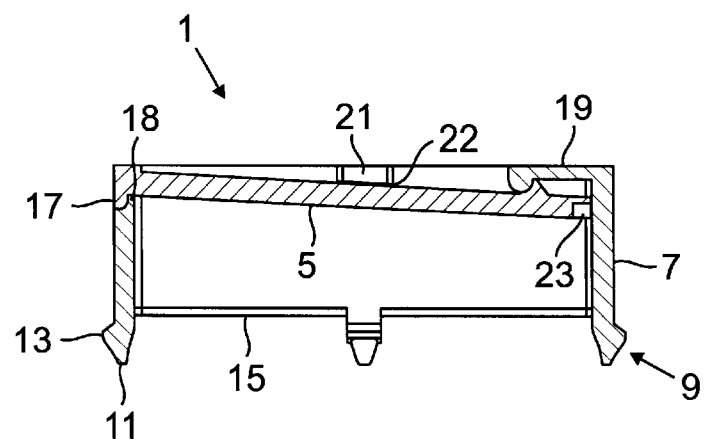
FIG. 3 is a cross-sectional view taken along line 3—3 of FIG. 1.

Referring specifically to FIGS. 1–3, each of the plurality of side walls 7 includes at least one snap-in fastener 9. The snap-in fasteners 9 are used to connect the base 3 to a circuit board (not shown) which includes electronic equipment thereon. Each of the snap-in fasteners 9 includes a narrow end portion 11 and a wide portion 13. The snap-in fasteners 9 are aligned with holes (not shown) in the circuit board and are pushed in through the holes in order to secure the base 3 to the circuit board. The snap-in fasteners 9 flex in order to allow the wide portion 13 to pass through the holes so that the circuit board is located between the wide portions 13 of the snap-in fasteners 9 and a lower surface 15 of each of the side walls 7.

Referring to FIGS. 1 and 3, one of the side walls 7 includes a recessed portion 17 which allows the cover 5 to slide onto the base 3. The recessed portion 17 is formed by a top of the side wall 7 being shorter than the remaining side walls 7. Furthermore, the side wall opposite to the side wall with the recessed portion 17 includes two snap-in securing tangs 19 for engaging with the cover 5. The remaining side walls 7 include reinforcing tabs 21 which also engage an upper surface of the cover 5.

Referring to FIG. 3, a lip 23 extends from the side wall 7 below each of the snap-in securing tangs 19. The lips 23 engage with the cover 5 to hold the cover 5 in a proper vertical location on the base 3 and in contact with the snap-in securing tangs 19. The lips 23 are illustrated in FIG. 3 as square-shaped projections formed on an inner surface of the side wall 7; however, the lips 23 can be of any shape as long as they are sufficiently sized to hold the cover 5 in position.

Figure 4:
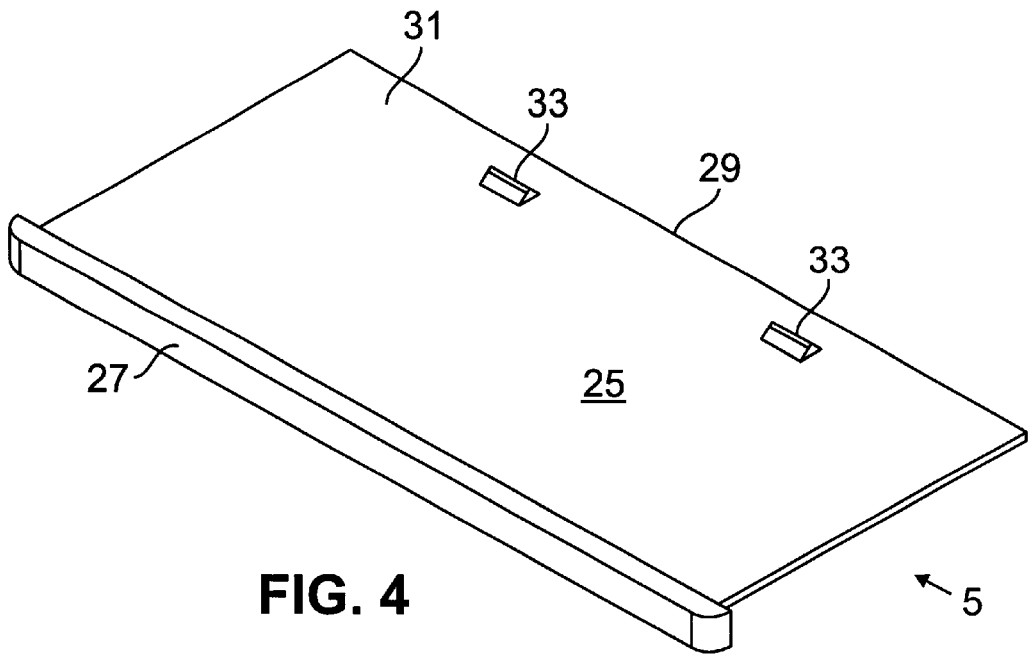
FIG. 4 is a top perspective view of the cover of the enclosure according to the first embodiment of the present invention.
Figure 5:
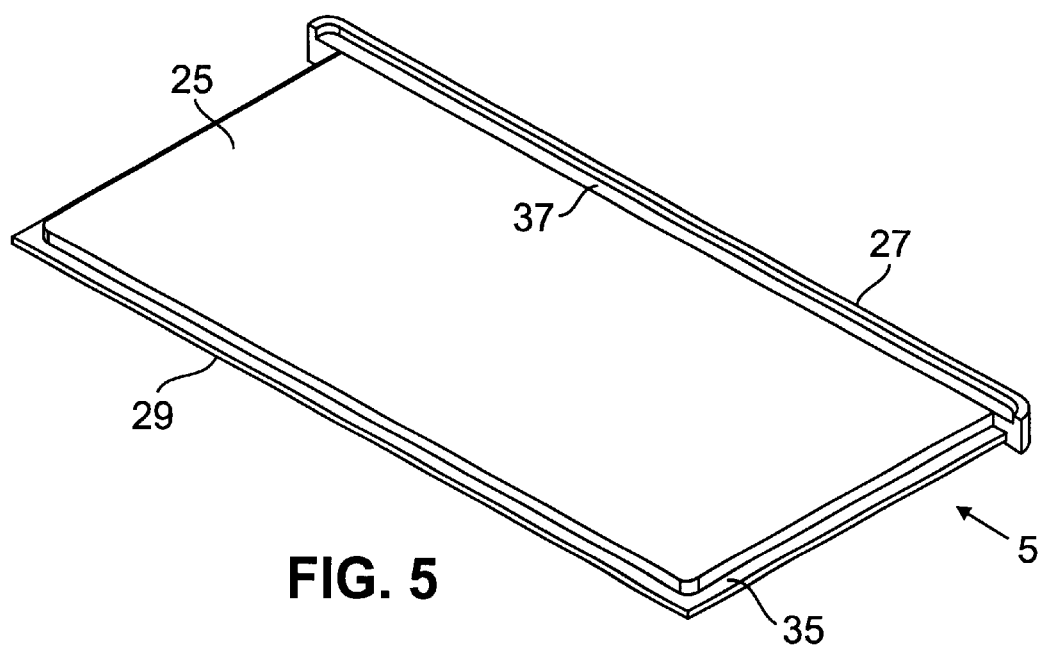
FIG. 5 is a bottom perspective view of the cover of the enclosure according to the first embodiment of the present invention.
Figure 6:
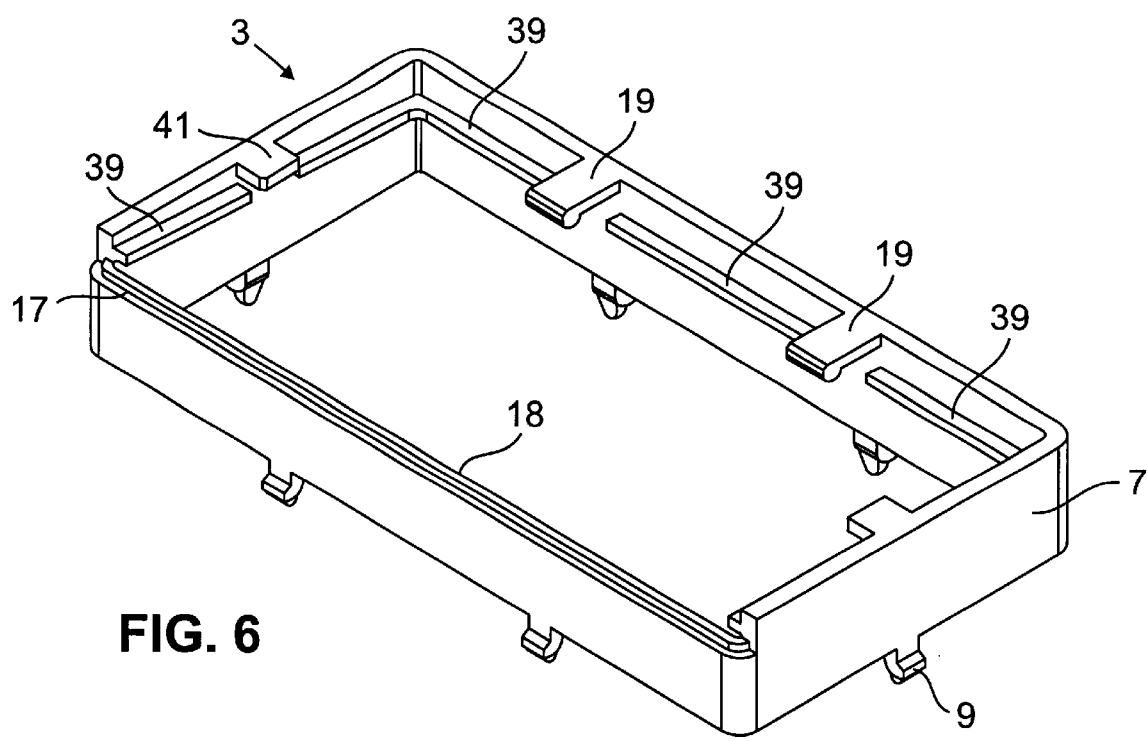
FIG. 6 is a top perspective view of the base of the enclosure according to a second embodiment of the present invention.
Figure 7:
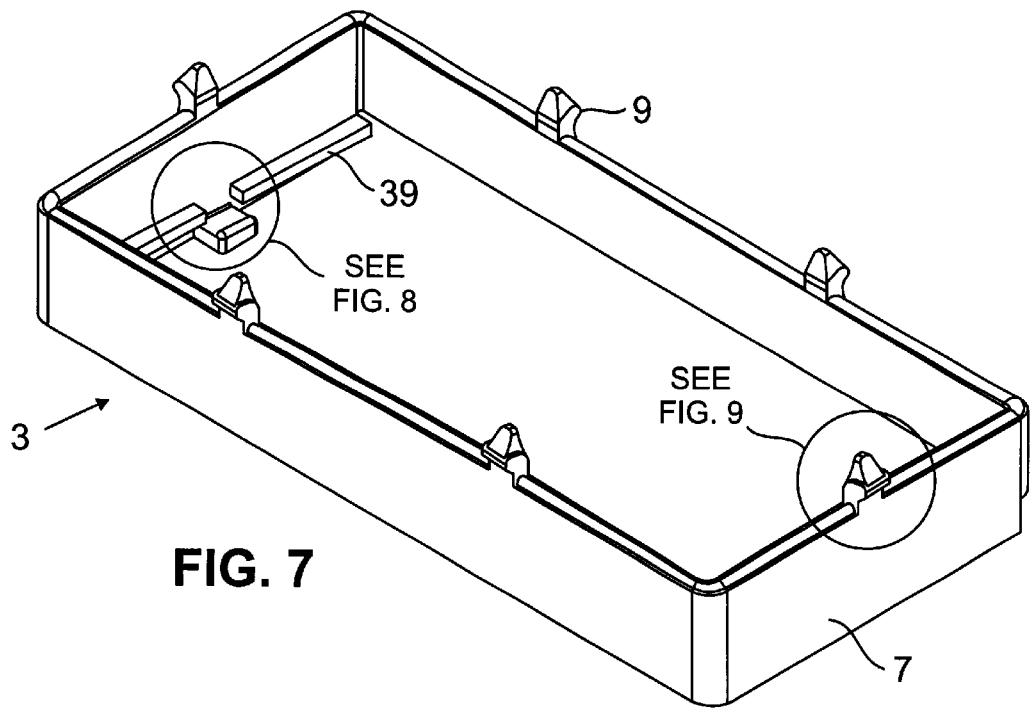
FIG. 7 is a bottom perspective view of the base of the enclosure according to the second embodiment of the present invention.

Referring now to FIGS. 4 and 5, the cover 5 includes a generally planar body portion 25 with an enlarged end 27 and a narrow end 29. An upper surface 31 of the cover 5 includes two projections 33 formed thereon for engaging with the snap-in securing tangs 19 of the base 3. Referring to FIG. 5, a bottom of the cover 5 includes an edge having a first recessed cut-out portion 35 formed therealong. Furthermore, the enlarged end 27 includes a second recessed cut-out portion 37 formed on a bottom surface thereof Referring to FIG. 3, the first recessed cut-out portion 35 is for engaging with the lips 23 when the cover 5 is attached to the base 3. Furthermore, the second recessed cut-out portion 37 is for engaging with an upper surface of the side wall 7 which includes the recessed portion 17.

The operation of the first embodiment of the present invention will now be described with reference to FIGS. 1 and 3. First, the base 3 is attached to a circuit board by aligning the snap-in fasteners 9 with holes formed in the circuit board (not shown). The snap-in fasteners are designed for easy alignment, since the narrow end portions 11 readily fit in the holes in the circuit board. The snap-in fasteners 9 are secured by pushing the base 3 toward the circuit board to engage the snap-in fasteners 9 within the holes formed in the circuit board. The snap-in fasteners 9 flex in order to allow the wide portion 13 to pass through the holes formed in the circuit board so that the circuit board is located between the wide portions 13 of the snap-in fasteners 9 and the lower surface 15 of the base 3.

Second, the narrow end 29 of the cover 5 is inserted into the recessed portion 17 of the side wall 7. The body portion 25 of the cover 5 is slid below the reinforcing tabs 21 and the narrow end 29 is brought into engagement with the lips 23 formed on the side wall 7. Furthermore, the projections 33 formed on the upper surface 31 of the cover 5 engage the snap-in securing tangs 19 to retain the on the base 3.

Referring to FIG. 3, the recessed portion 17 includes a projecting portion 18 for engaging with the second recessed cut-out portion 37 formed in the enlarged end 27. A lower surface 22 of the reinforcing tabs 21 tapers toward the recessed portion 17. Furthermore, the lips 23 are located a predetermined distance below the snap-in securing tangs 19 so that the cover 5 slides in at an angle. The angular sliding of the cover 5 allows several enclosures 1 to be located adjacent to each other in close proximity without interference between adjacent enclosures when a cover 5 is removed or attached.

The cover 5 can be easily removed from the base 3 by merely pressing down on the upper surface 31 of the cover 5 adjacent to the snap-in securing tangs 19 in order to disengage the projections 33 from the snap-in securing tangs 19. The cover 5 is then slid away from the lips 23 and out of the recessed portion 17 in order to disengage the cover 5 from the base 3 to allow access to the electronic equipment which is secured to the circuit board within the base 3.

A second embodiment of the present invention will now be described with reference to FIGS. 6–9. The second embodiment of the present invention is substantially the same as the first embodiment; however, instead of providing the lips 23 below each of the snap-in securing tangs 19 as in the first embodiment, a plurality of elongated lips 39 are provided on three of the side walls 7 between the snap-in securing tangs 19 and the reinforcing tabs 41. Furthermore, elongated lips 39 are provided extending from adjacent the reinforcing tabs 41 to a position adjacent to the side wall 7 which includes the recessed portion 17. The elongated lips 39 engage the first recessed cut-out portion 35 formed in the cover 5. The cover 5 of the first embodiment illustrated in FIGS. 4 and 5 is usable in the second embodiment as well.

Figure 8:
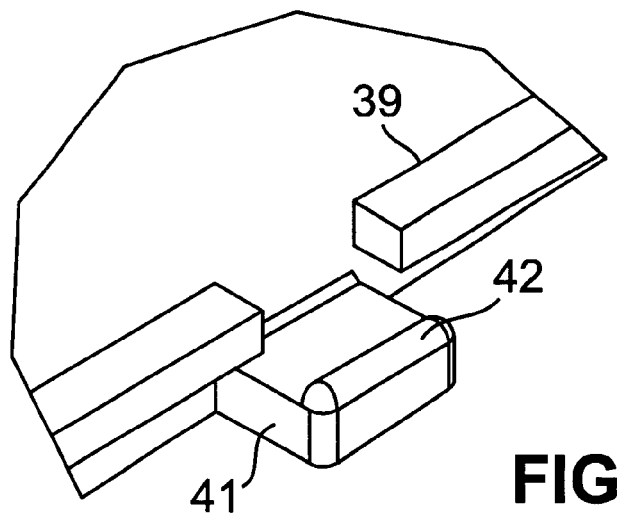
FIG. 8 is a detail view of a retaining tab of FIG. 7.

Referring to FIG. 8, a detail view of the reinforcing tab 41 is shown. The reinforcing tab 41 includes a projecting portion 42 formed thereon. The projecting portion 42 engages the upper surface 31 of the cover 5 when the cover 5 is attached to the base 3. The elongated lips 39 and the reinforcing tab 41, according to the second embodiment of the present invention, provide a more secure attachment between the cover 5 and the base 3. Therefore, the protection against EMI is enhanced.

Figure 9:
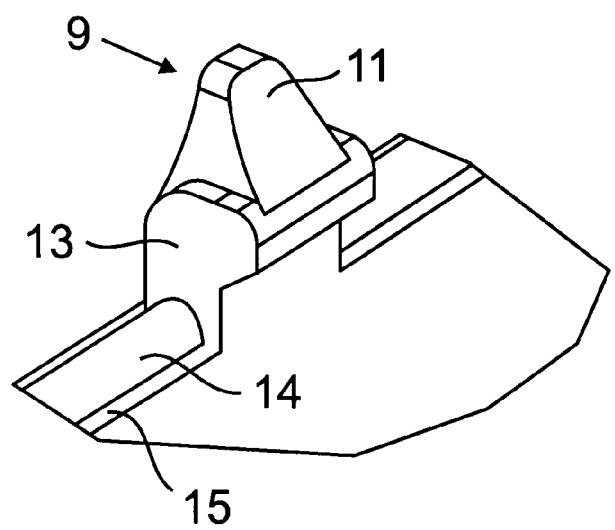
FIG. 9 is a detail view of a snap-in fastener of FIG. 7.
Figure 10:
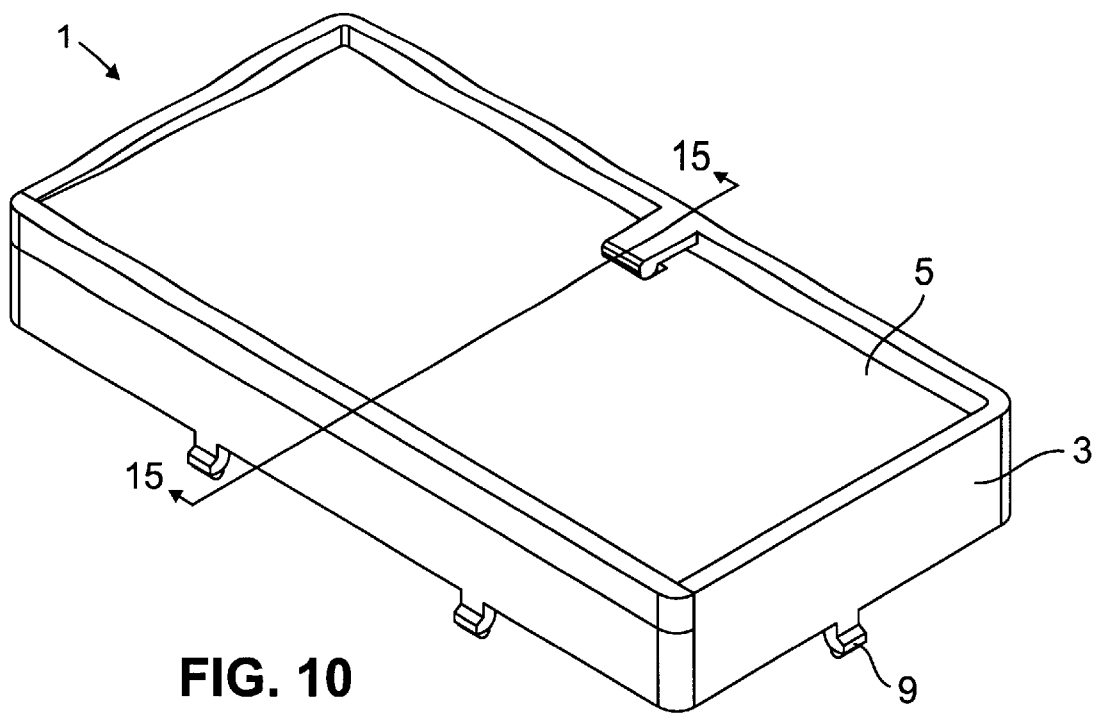
FIG. 10 is a perspective view of the enclosure according to a third embodiment of the present invention.
Figure 11:
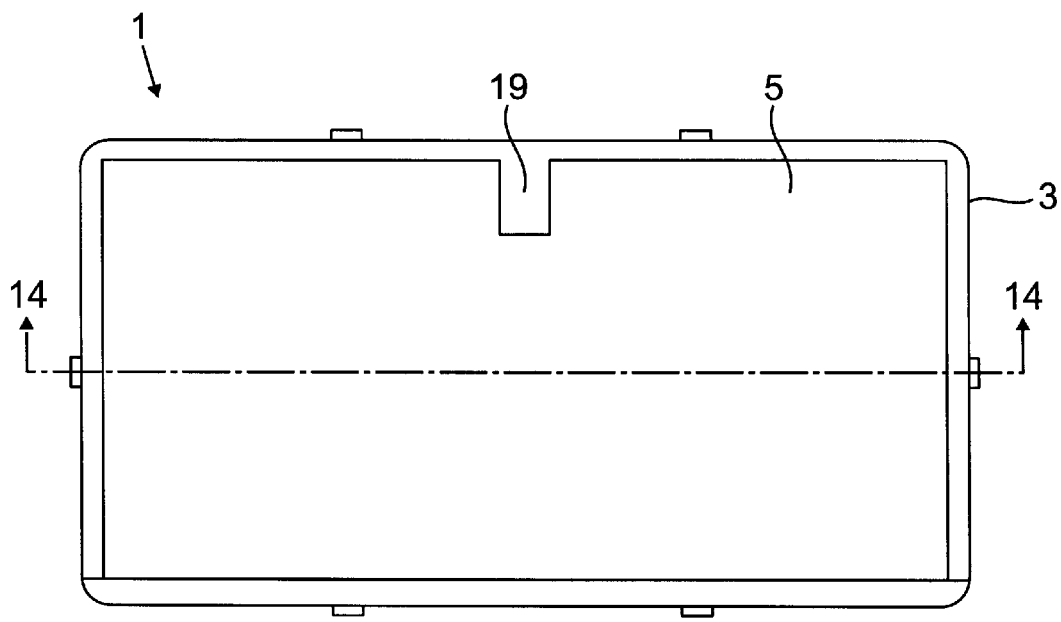
FIG. 11 is a top view of the enclosure according to the third embodiment of the present invention.

Referring to FIG. 9, a detail of one of the snap-in fasteners 9 is illustrated. The snap-in fastener 9 includes the narrow end portion 11 and the wide portion 13 substantially the same as in the first embodiment. The shape of the snap-in fasteners 9 promote ease of assembly. The narrow end portions 11 readily fit in the holes in the circuit board and the wide portions 13 sit on a top of the hole until they are pressed through the holes by application of a force on the base 3. FIG. 9 also illustrates the lower surface 15 of the base 3 including a curved portion 14 formed thereon. The lower surface 15 of the base 3 may engage a complimentary groove (not shown) formed in the circuit board. It is noted however, that the lower surface 15 of the base 3 may have a flat construction for engaging with a flat surface of the circuit board. Alternatively, the curved portion 14 may be used with a circuit board which does not include a complimentary grooved portion. Other shapes may also be used for the lower surface 15 and the snap-in fasteners 9 as long as the base 3 is securely held to the circuit board.

The operation of the second embodiment of the present invention is similar to the operation of the first embodiment. The base 3 is secured to a circuit board by pushing the snap-in fasteners 9 through holes formed in the circuit board. The cover 5 is then inserted, narrow end 29 first, through the recessed portion 17 formed in one of the side walls 7. The first recessed cut-out portion 35 of the cover 5 engages with the elongated lips 39 and is slid under the reinforcing tabs 41. The narrow end 29 of the cover 5 is inserted under the snap-in securing tangs 19 so that the snap-in securing tangs 19 engage with the projections 33 formed on the upper surface 31 of the cover 5. Furthermore, the projecting portion 18 engages with the second recessed cut-out portion 37 formed in the enlarged end 27 of the cover 5.

Referring again to FIG. 8, the projecting portions 42 include an angled lower surface and the elongated lips 39 are angled downwardly to allow the cover 5 to slide downwardly along the elongated lips 39 to a position substantially the same as the position of the cover 5 in the first embodiment. Once again, the angular sliding of the cover 5 allows enclosures 1 to be located adjacent to each other without interfering with each other.

The cover 5 can be easily removed from the base 3 by merely pressing down on the upper surface 31 of the cover 5 adjacent to the snap-in securing tangs 19 in order to disengage the projections 33 from the snap-in securing tangs 19. The cover 5 is then slid along the elongated lips 39 and out of the recessed portion 17 in order to disengage the cover 5 from the base 3 to allow access to the electronic equipment which is secured to the circuit board within the base 3.

A third embodiment of the present invention will now be described with reference to FIGS. 10–17. The third embodiment of the present invention is substantially the same as the first and second embodiments of the present invention, except that the base 3 includes only one snap-in securing tang 19 and no reinforcing tabs 21 or 41 are provided. Furthermore, instead of providing the lips 23 or the elongated lips 39 on three of the side walls, as in the first and second embodiments, a groove 45 is formed on an inside surface of the three side walls 7 extending generally around the entire circumference of the three side walls 7. This arrangement is advantageous since there are no spaces remaining between the cover 5 and the base 3 which would allow electromagnetic radiation to pass therethrough.

Although the third embodiment includes only one snap-in securing tang 19 and no reinforcing tabs 21 or 41, it will be understood that additional snap-in securing tangs 19 can be provided and that reinforcing tabs 21 or 41 may also be provided in order to further enhance the connection between the cover 5 and the base 3. Not providing securing tangs 19; however, makes more space available within the base 3 for testing or repair of the electronic equipment within the base.

Figure 12:
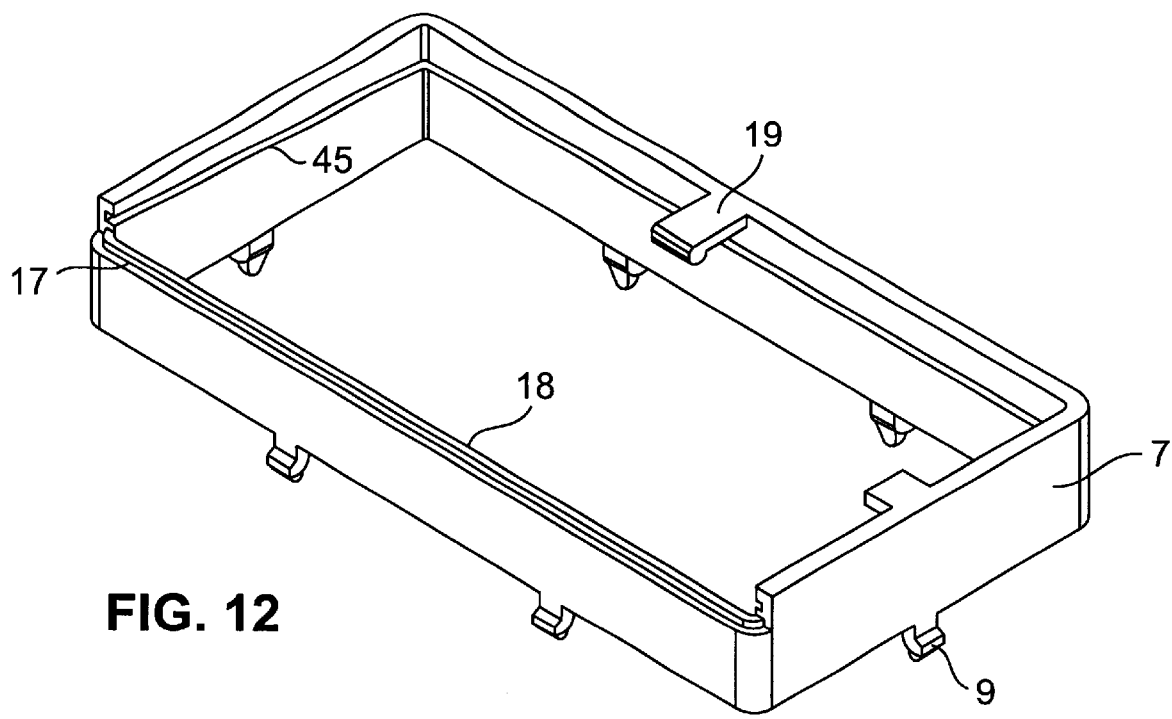
FIG. 12 is a top perspective view of the base of the enclosure according to the third embodiment of the present invention.
Figure 13:
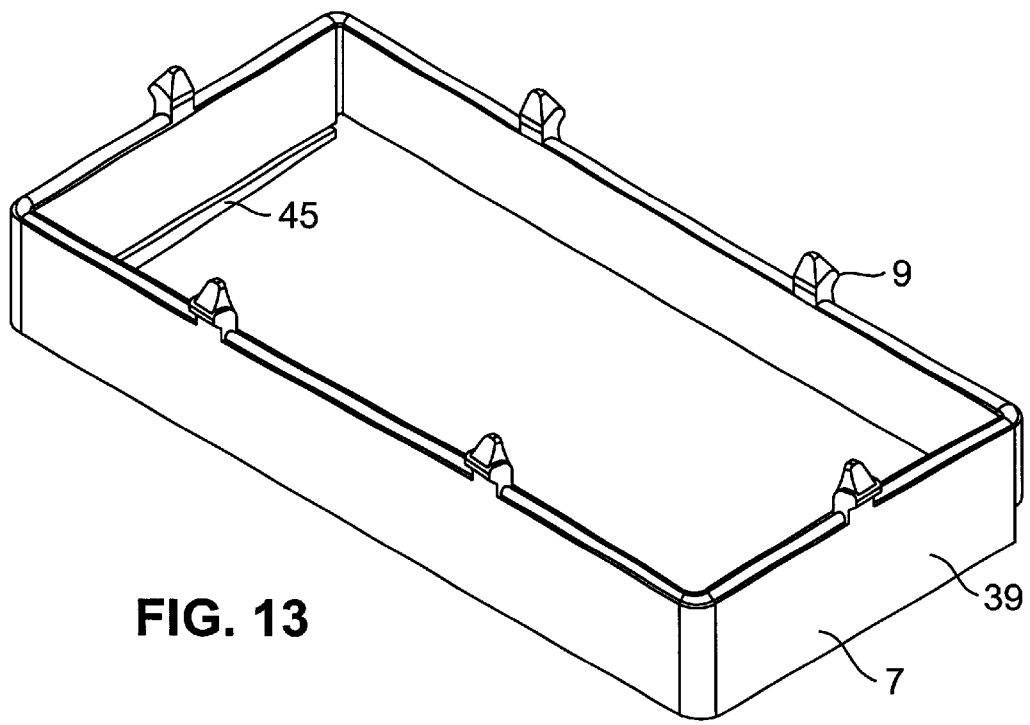
FIG. 13 is a bottom perspective view of the base of the enclosure according to the third embodiment of the present invention.
Figure 14:
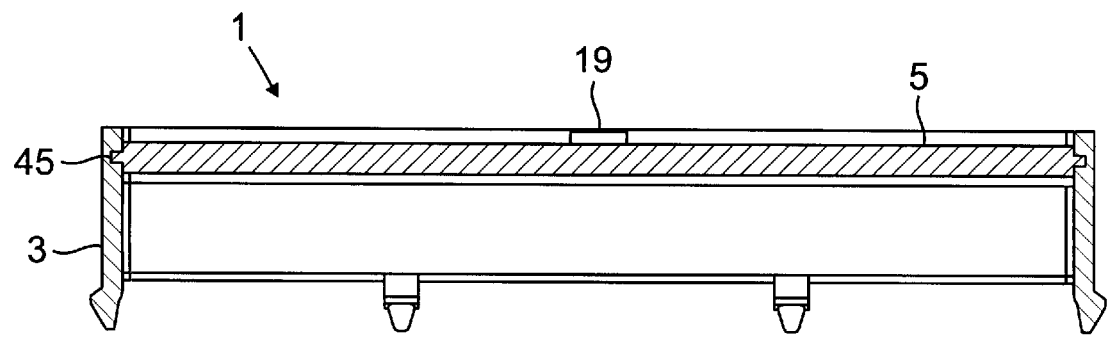
FIG. 14 is a cross-sectional view of the enclosure taken along the line 14—14 of FIG. 11.
Figure 15:
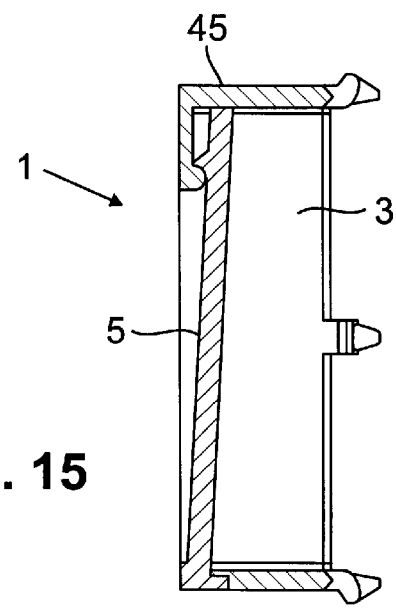
FIG. 15 is a cross-sectional view of the enclosure taken along the line 15—15 of FIG. 10.

Referring to FIGS. 12 and 13, the groove 45 is angled downwardly away from the recessed portion 17. Furthermore, the groove 45 is located a predetermined distance away from the snap-in securing tang 19 so that the cover 5 slides in at an angle to a position as illustrated in FIG. 15.

Figure 16:
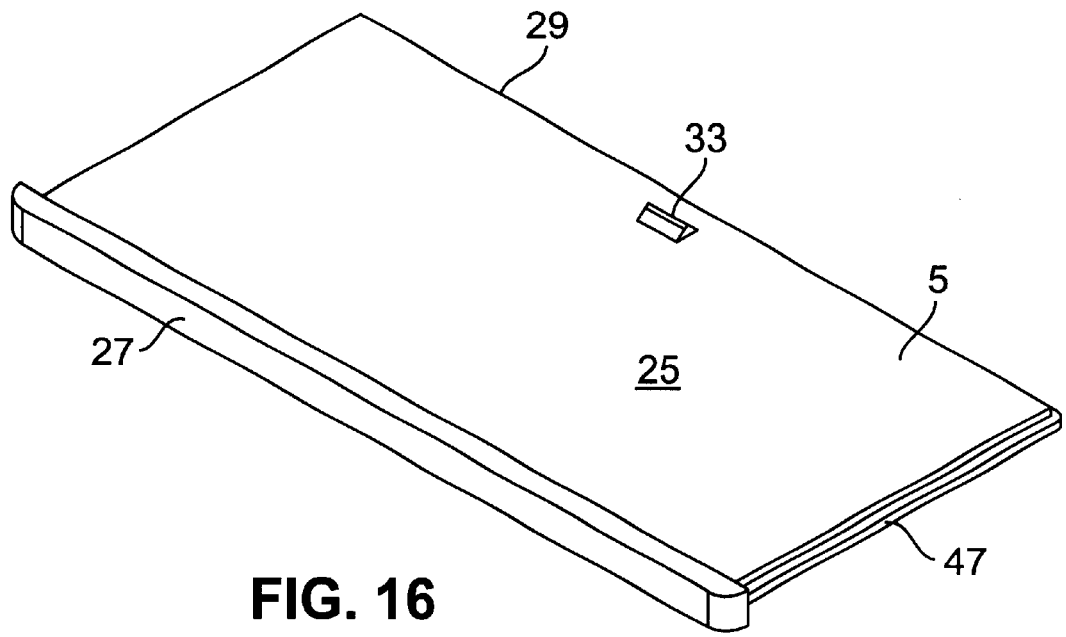
FIG. 16 is a top perspective view of the cover of the enclosure according to the third embodiment of the present invention.
Figure 17:
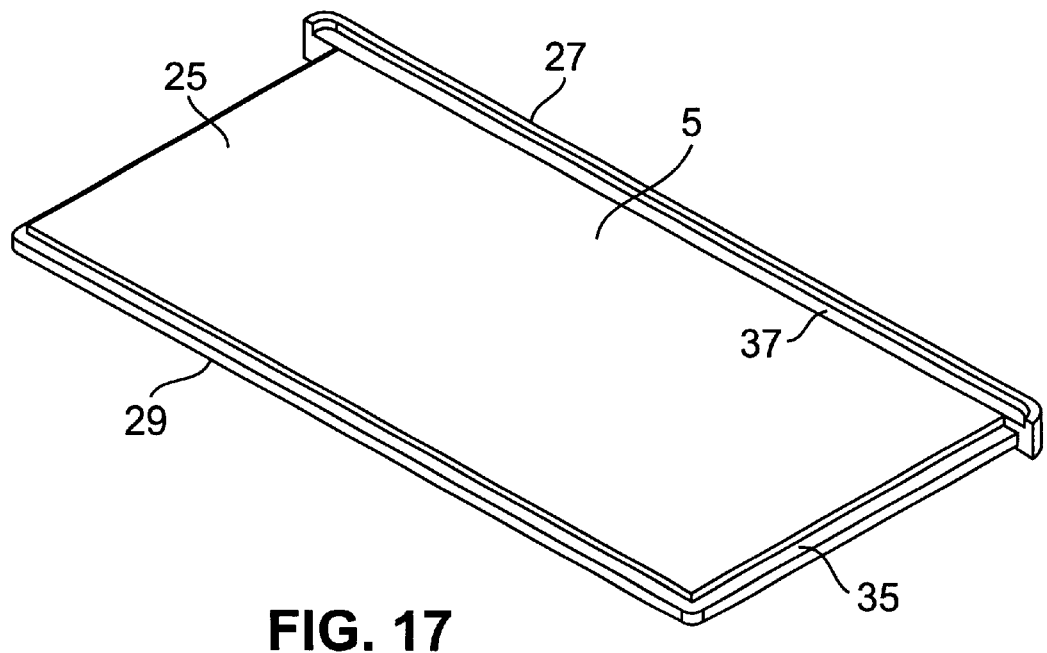
FIG. 17 is a bottom perspective view of the cover of the enclosure according to the third embodiment of the present invention.

Referring to FIGS. 16 and 17, the cover 5 includes a third recessed cut-out portion 47 formed along the edges of upper surface 31 of the body portion 25 as well as the first recessed cut-out portion 35 formed along the edges of the bottom of the cover 5. This allows the edges of the cover 5 to slide within the groove 45 formed in the base 3. The cover 5 also includes one projection 33 formed on the upper surface 31 for engaging with the snap-in securing tang 19 formed on the base 3.

The operation of the third embodiment of the present invention is substantially the same as the first and second embodiments. The base 3 is first secured to the circuit board (not shown) by snapping the snap-in fasteners 9 through holes formed in the circuit board. The narrow end 29 of the cover 5 is then inserted through the recessed portion 17 formed in one of the side walls 7 and slid along the groove 45 so that the narrow end 29 is located beneath the snap-in securing tang 19 in order to engage the projection 33 formed on the cover 5 with the snap-in securing tang 19.

The cover 5 can be easily removed from the base 3 by merely pressing down on the upper surface 31 of the cover 5 adjacent to the snap-in securing tang 19 in order to disengage the projection 33 from the snap-in securing tang 19. The cover 5 is then slid along the groove 45 in order to disengage the cover 5 from the base 3 to allow access to the electronic equipment which is secured to the circuit board within the base 3.

Figure 21:
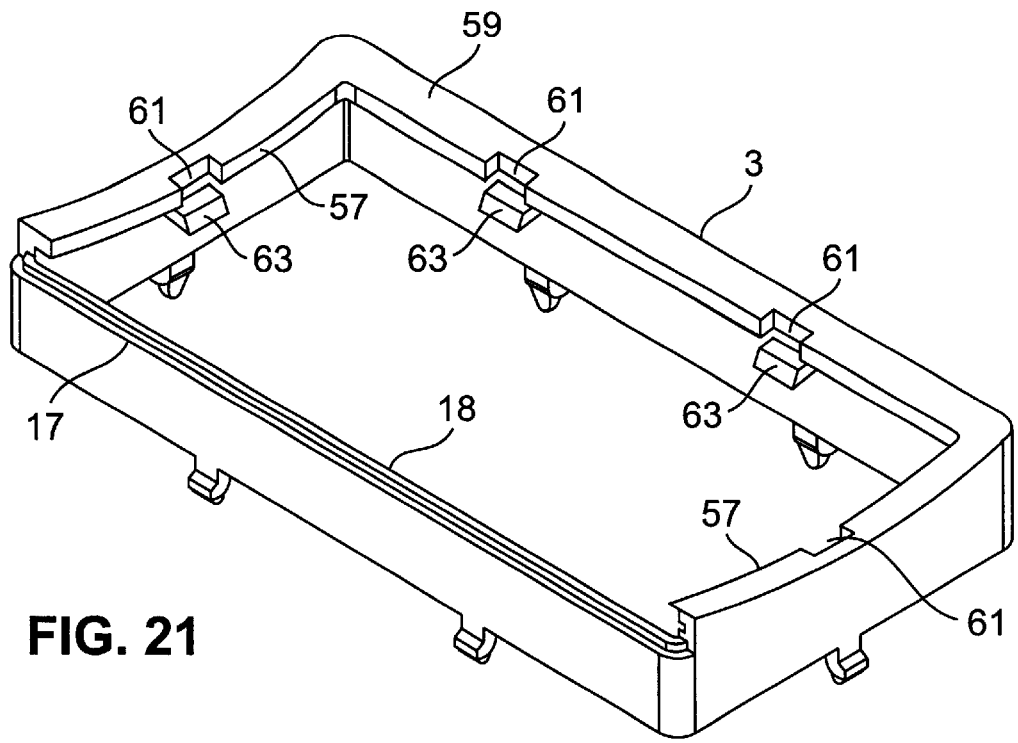
FIG. 21 is a top perspective view of the base of the enclosure according to the fourth embodiment of the present invention.
Figure 22:
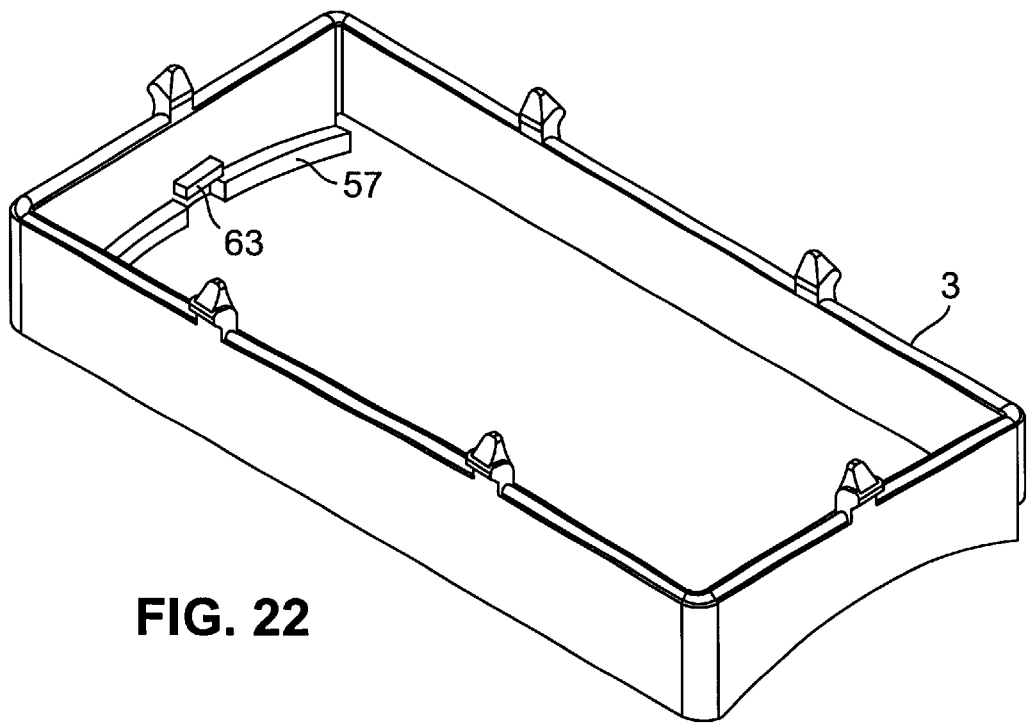
FIG. 22 is a bottom perspective view of the base of the enclosure according to the fourth embodiment of the present invention.

A fourth embodiment of the present invention will now be described with reference to FIGS. 18–21. The fourth embodiment of the present invention is substantially similar to the first through third embodiments; however, the cover 5 includes a curved body 55. The cover 5 is curved in order to decrease interference with adjacent parts and adjacent enclosures 1. Referring to FIGS. 21 and 22, the base 3 includes a lip 57 extending from an upper surface 59 of the base 3. The lip 57 is divided into separate pieces by cut-out portions 61. Furthermore, a plurality of tabs 63 are provided below the lip 57 and aligned with the cut-out portions 61.

Figure 23:
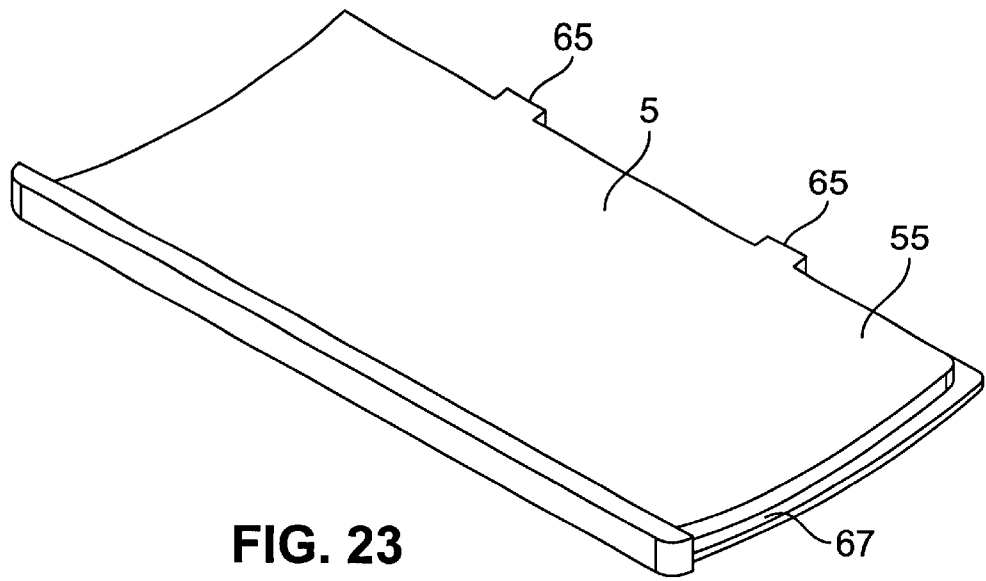
FIG. 23 is a top perspective view of the cover of the enclosure according to the fourth embodiment of the present invention.
Figure 24:
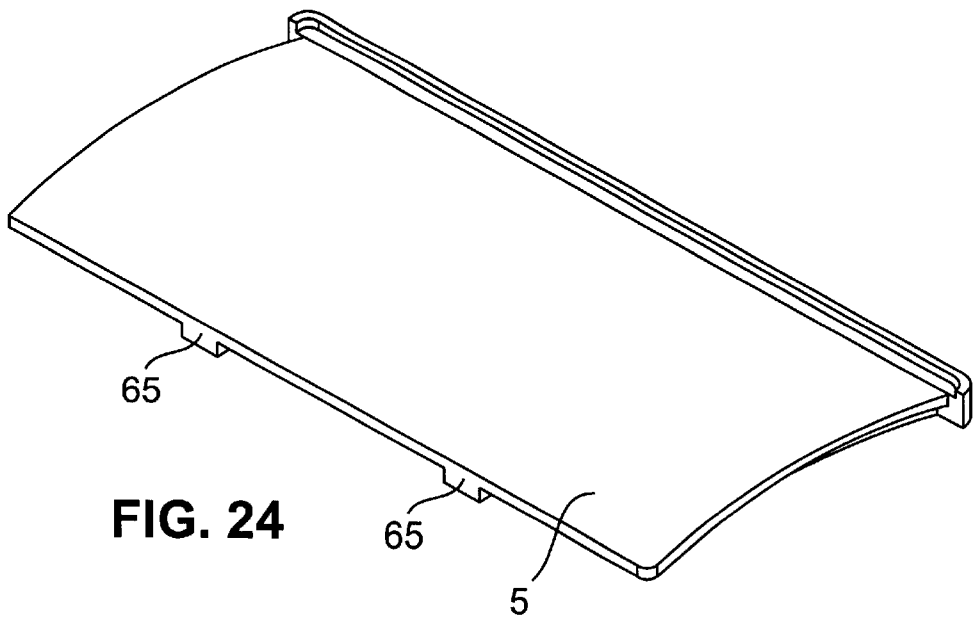
FIG. 24 is a bottom perspective view of the cover of the enclosure according to the fourth embodiment of the present invention.
Figure 25:
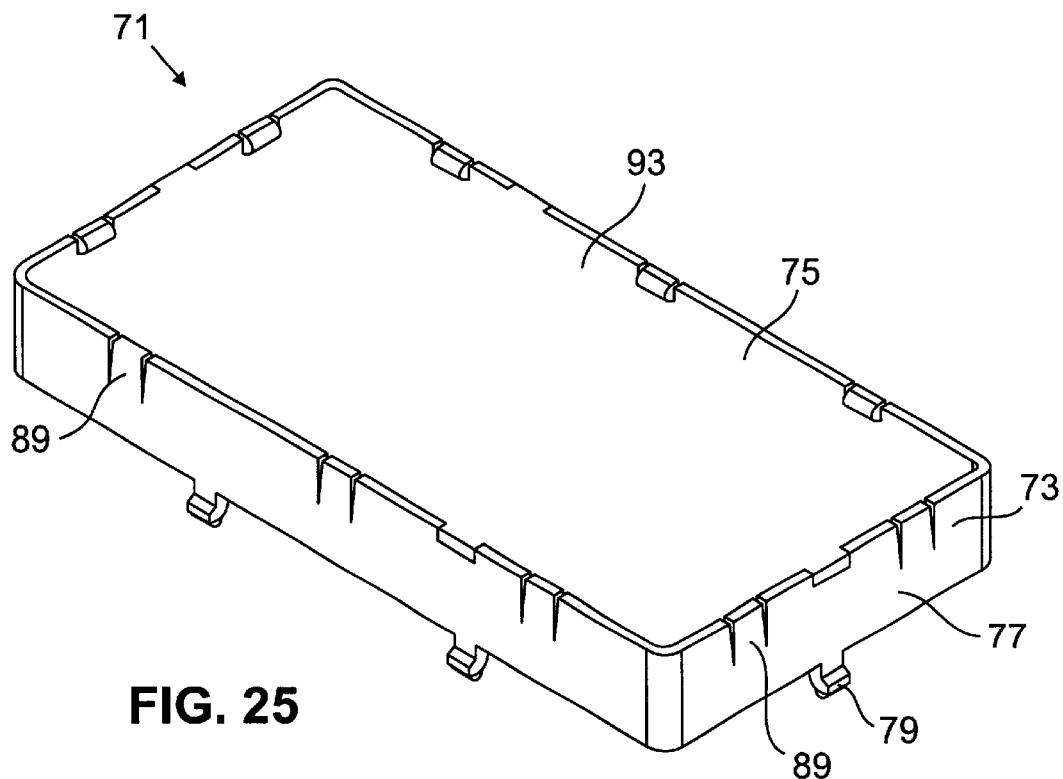
FIG. 25 is a top perspective view of the enclosure according to a fifth embodiment of the present invention.
Figure 26:
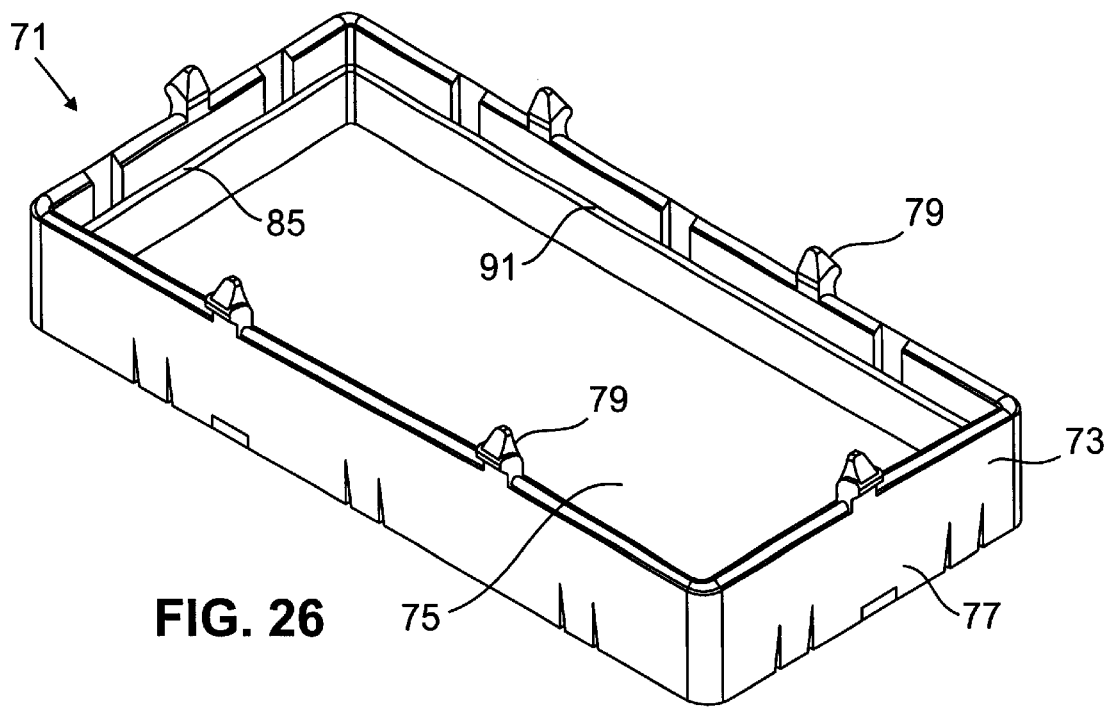
FIG. 26 is a bottom perspective view of the enclosure according to the fifth embodiment of the present invention.
Figure 27:
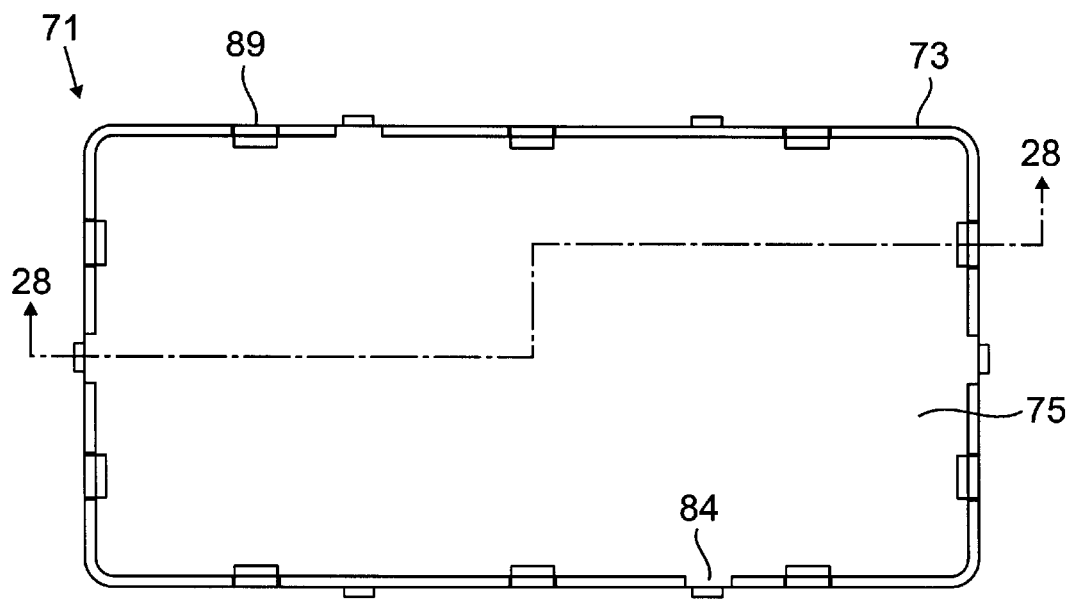
FIG. 27 is a top view of the enclosure according to the fifth embodiment of the present invention.
Figure 28:
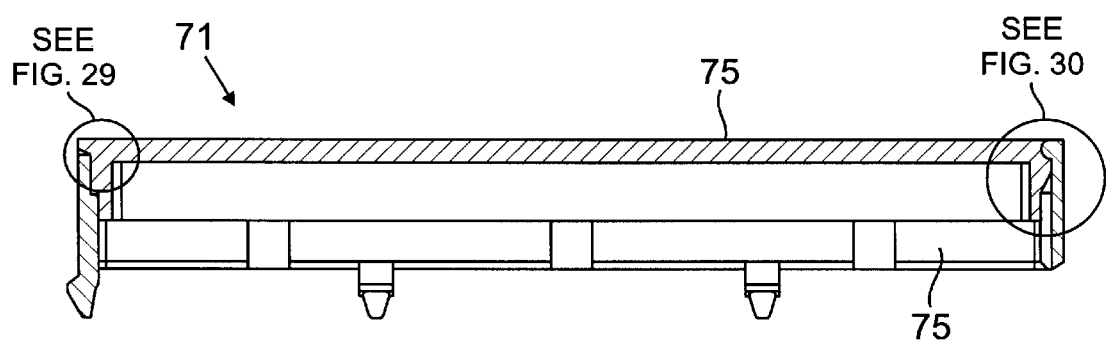
FIG. 28 is a cross-sectional view of the enclosure taken along the line 28—28 of FIG. 27.
Figure 29:
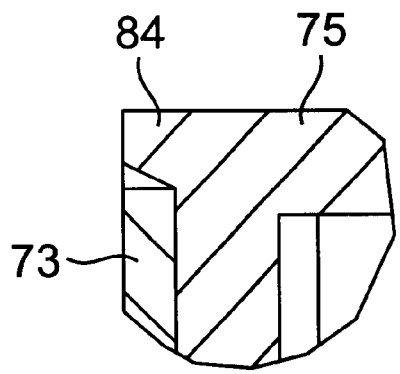
FIG. 29 is a detail view of a connection between the cover and the base of the enclosure of FIG. 28.
Figure 30:
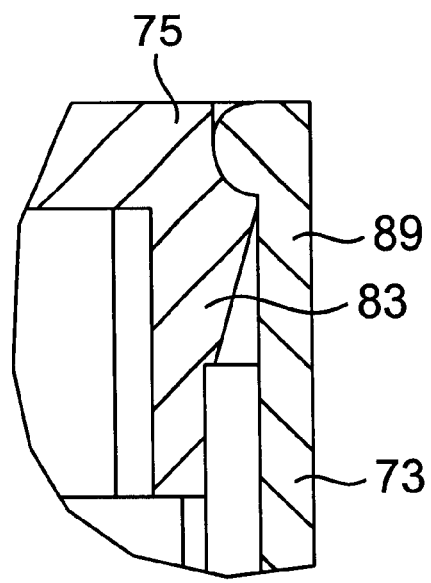
FIG. 30 is a detail view of a snap-in securing tang of FIG. 28.

Referring to FIGS. 23 and 24, the cover 5 includes a pair of projecting tabs 65 which engage with the cut-out portions 61 formed in the side wall 7 which is opposite to the side wall which includes the recessed portion 17. The cover 5 includes a recessed cut-out portion 67 formed along the edge of the upper surface 31 thereof. The projecting tabs 65 extend into this recessed cut-out portion 67.

The operation of the fourth embodiment of the present invention is similar to the operation of the first through third embodiments. Specifically, the base 3 is secured to a circuit board (not shown) by pushing the snap-in fasteners 9 through holes formed in the circuit board. The cover 5 is then inserted through the recessed portion 17 and slid along the lip 57 such that it is below the lip 57 and above each of the tabs 63. The lip 57 engages the cut-out portion 67 of the cover 5. The narrow end 29 of the cover 5 is then slid to engage the projecting tabs 65 within the cut-out portions 61 formed on the side wall 7 opposite to the side wall with the recessed portion 17. The cover 5 is then securely attached to the base 3 in order to protect the electronic equipment within the base 3 from electromagnetic radiation.

Figure 18:
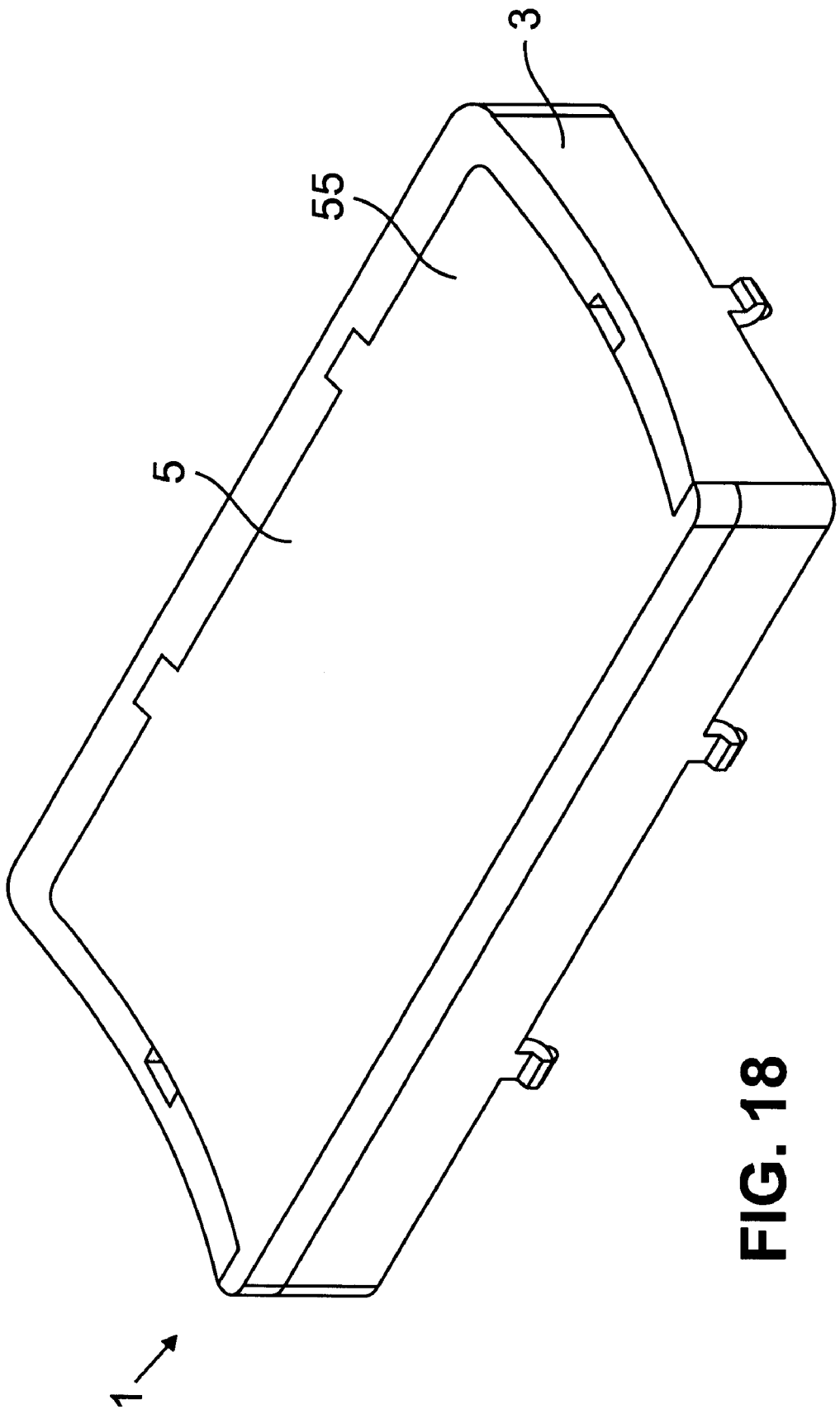
FIG. 18 is a perspective view of the enclosure according to a fourth embodiment of the present invention.
Figure 19:
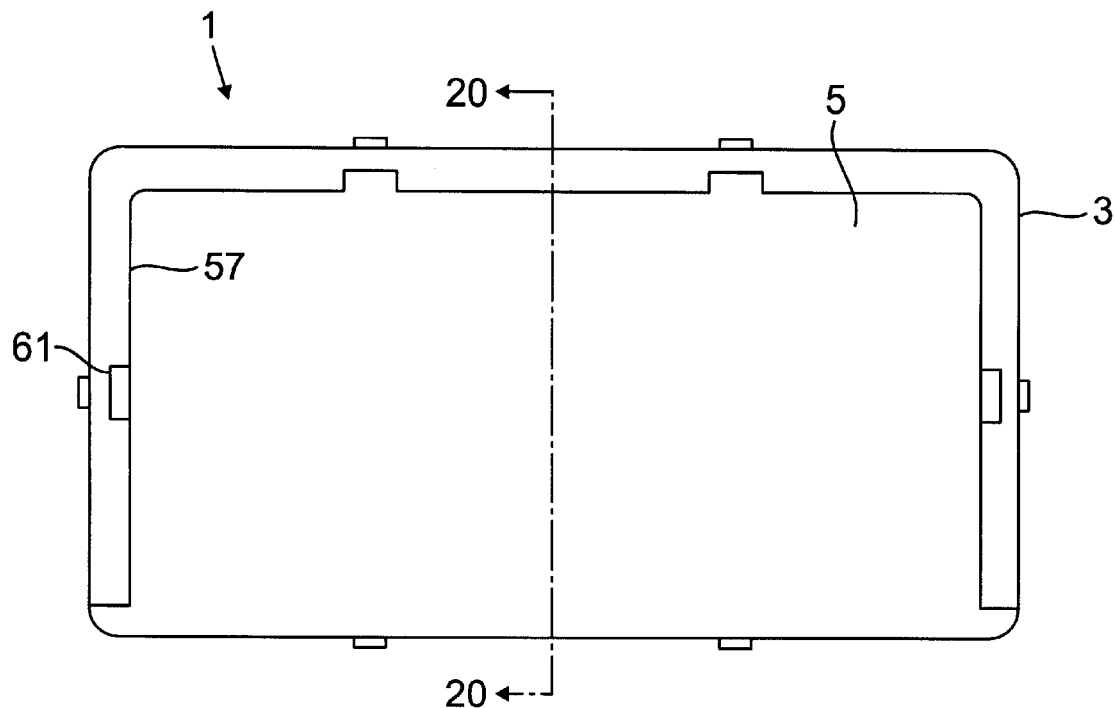
FIG. 19 is a top view of the enclosure according to the fourth embodiment of the present invention.
Figure 20:
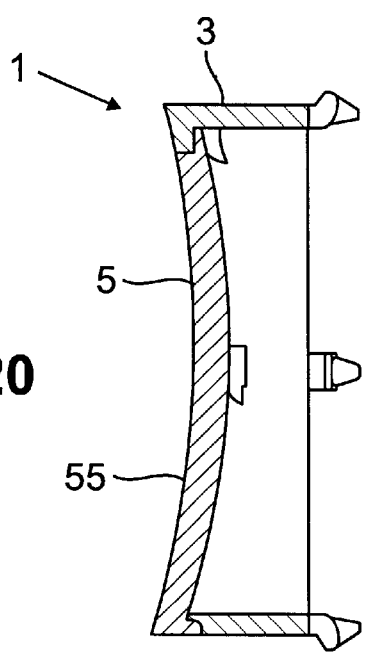
FIG. 20 is a cross-sectional view of the enclosure taken along the line 20—20 of FIG. 19.

Referring to FIGS. 18–20, when the cover 5 is attached to the base 3, the upper surface 59 of the base 3 and the upper surface 31 of the cover 5 form a single continuous surface. The upper surface 59 of the base 3 is curved in order to accommodate the curvature of the cover 5.

In order to remove the cover 5 from the base 3, the cover is slid out of the base 3 in the reversed direction to the inserted direction. It is unnecessary to press down on the cover 5, since there are no snap-in securing tangs which must be disengaged. The geometry of the curved body 55 ensures that the cover 5 remains in place without the necessity of providing snap-in securing tangs. Furthermore, it is envisioned that the curvature of the curved body 55 and/or the recessed cut-out portion 67 would be slightly greater or less than the curvature of the lip 57 of the base 3. Therefore, the natural resilience of the curved body 55 and/or the recessed cut-out portion 67 would cause frictional engagement to assist in holding the cover 5 in the closed position.

A fifth embodiment of the present invention will now be described with reference to FIGS. 25–32. The enclosure 71 according to the fifth embodiment of the present invention includes a base 73 and a cover 75. The base 73 includes a plurality of side walls 77 connected to each other to form a space therebetween. A plurality of snap-in fasteners 79 are formed on a lower surface of the side walls 77. Furthermore, a plurality of snap-in securing tangs 89 are formed on each of the side walls 77 extending parallel to the side walls 77. The snap-in tangs 89 cooperate with projections 83 formed on the cover 75. Furthermore, the base 73 includes a plurality of cut-out portions 81 formed in an upper surface 82 of each of the side walls 77. The cut-out portions 81 each receive a tab 84 formed on the cover 75.

Figure 31:
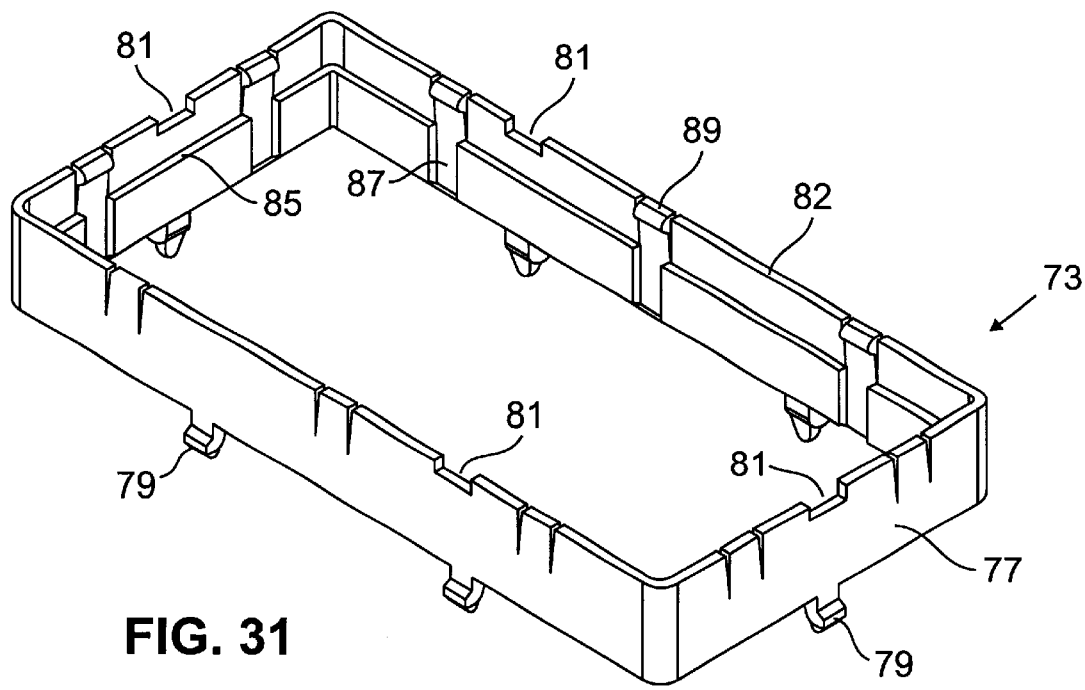
FIG. 31 is a perspective view of the base of the enclosure according to the fifth embodiment of the present invention.
Figure 32:
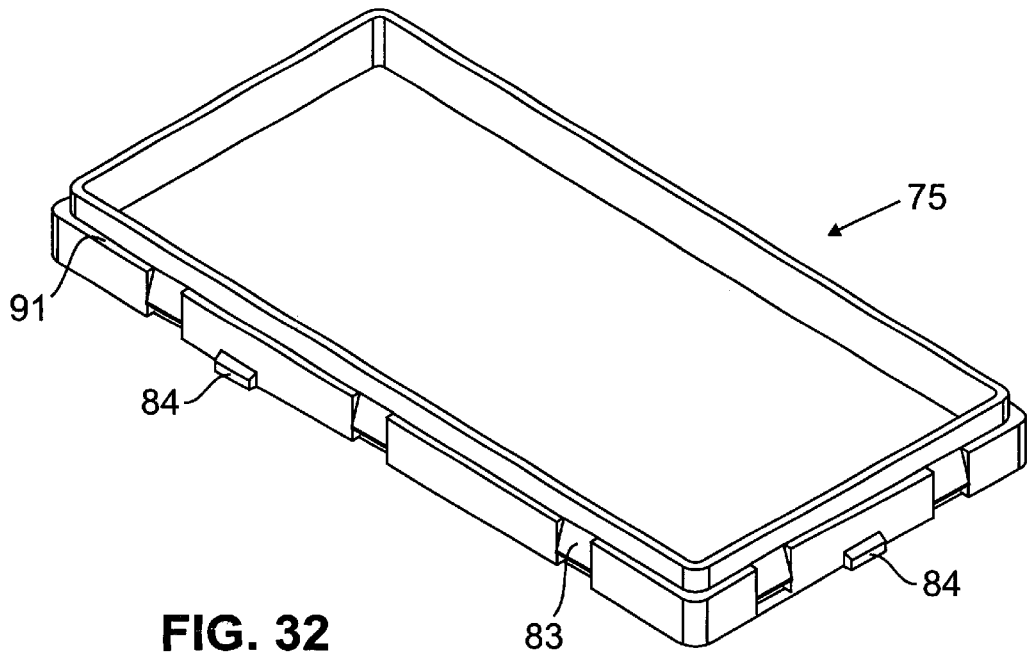
FIG. 32 is a perspective view of the cover of the enclosure according to the fifth embodiment of the present invention.

Referring to FIG. 31, the base 73 includes a lip 85 formed along an inside surface of each of the side walls 77. The lip 85 includes a plurality of gaps 87 which are located aligned with each of the snap-in securing tangs 89. Referring to FIG. 32, the lip 85 engages a shoulder 91 which is formed by a recessed portion of the cover 75.

The fifth embodiment of the present invention operates in a manner different than the first through fourth embodiments. The fifth embodiment is specifically used in areas where insufficient access to the enclosure is provided on sides of the enclosure. The cover 75 is inserted from the top of the base 73 in a vertical direction. The cover 75 is pushed into the space formed by the base 73 so that each of the projections 83 align with a respective snap-in securing tang 89 and each of the tabs 84 align with a respective cut-out portion 81 formed in the base 73. The cover is pushed downwardly until it reaches a position as illustrated in FIGS. 25–30. In this position, the upper surface 93 of the cover 75 is generally parallel to the upper surface 82 of the base 73. Furthermore, the shoulder 91 of the cover 75 engages the lip 85 of the base 73.

In order to gain access to the electronic equipment within the base 73, one needs to use a tool such as a screw driver to disengage the snap-in securing tangs 89 from the projections 83. This will allow the cover 75 to be removed from the base in a vertical direction opposite to the insertion direction.

The EMI shielding enclosure of the present invention can be made from numerous EMI reflecting and/or absorbing materials or electrically conductive materials. The preferred materials of the present invention are Ni coated graphite and polycarbonate or similar materials. The EMI enclosure can also be made of other polymers. In addition, the above-mentioned materials may be further coated with Ni—Cu or Ni—Cu—Ni electrolessly applied. Alternatively, the EMI shielding enclosure of the present invention can be made of metal, such as magnesium or aluminum. Magnesium is preferable, since it can be made thinner than aluminum.

It is noted that the first through fifth embodiments of the present invention include four side walls 7 connected together in the shape of a rectangle; however, the number and shape of the side walls and how they are connected together can be of any number and shape depending upon the electronic equipment which is being enclosed. Furthermore, the base 3, 73 of the enclosures 1, 71 in the first through fifth embodiments may include separators therein in order to separate various pieces within an enclosure from each other. Separators within the enclosures form individual cavities which provide protection against EMI between electronic equipment within the cavities of the enclosures.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. An enclosure for protecting electronic equipment from electromagnetic interference comprising:

a base made of an EMI absorbing or reflecting material, said base including a plurality of fastening elements formed on a bottom thereof, a first securing element formed thereon and a lip formed thereon; and a cover made of an EMI absorbing or reflecting material, said cover including a second securing element formed thereon for engaging with said first securing element formed on said base and a recessed portion formed thereon for engaging said lip.

2. The enclosure for protecting electronic equipment from electromagnetic interference according to claim 1, wherein said second securing element includes a raised portion formed on a first surface of said cover, and said first securing element is a tang engageable with said raised portion.

3. The enclosure for protecting electronic equipment from electromagnetic interference according to claim 2, wherein said base includes a plurality of side walls secured together and defining a space therebetween, and said tang extends into said space.

4. The enclosure for protecting electronic equipment from electromagnetic interference according to claim 1, wherein said cover includes a body portion and a plurality of walls extending therefrom, and said second securing element is formed on an outside surface of at least one of said walls.

5. The enclosure for protecting electronic equipment from electromagnetic interference according to claim 1, wherein said EMI absorbing or reflecting material includes Ni coated graphite.

6. The enclosure for protecting electronic equipment from electromagnetic interference according to claim 1, wherein said EMI absorbing or reflecting material includes a polymeric material.

7. The enclosure for protecting electronic equipment from electromagnetic interference according to claim 1, wherein said second securing element includes a projection formed in said recessed portion of said cover, and said first securing element includes said lip including a recessed portion formed therein for receiving said projection.

8. The enclosure for protecting electronic equipment from electromagnetic interference according to claim 1, further comprising at least one reinforcing element formed on said base, said at least one reinforcing element is engageable with a first surface of said cover.

9. An enclosure for protecting electronic equipment from electromagnetic interference comprising:
   a base including a plurality of EMI shielding side walls, at least one of said plurality of side walls including a lip formed thereon;
   at least one fastening element formed on at least one of said plurality of side walls;
   an EMI shielding cover, said cover including a recessed portion formed thereon for engaging said lip; and
   a second securing element formed on said cover for cooperating with a first securing element formed on at least one of said plurality of side walls.

10. The enclosure for protecting electronic equipment from electromagnetic interference according to claim 9, wherein said second securing element includes a raised portion formed on a first surface of said cover, and said first securing element is a tang engageable with said raised portion.

11. The enclosure for protecting electronic equipment from electromagnetic interference according to claim 10, wherein said plurality of side walls are secured together to define a space therebetween, and said tang extends into said space.

12. The enclosure for protecting electronic equipment from electromagnetic interference according to claim 9, wherein said cover includes a top and a plurality of walls extending therefrom, and said second securing element is formed on an outside surface of at least one of said walls.

13. The enclosure for protecting electronic equipment from electromagnetic interference according to claim 9, wherein said second securing element includes a projection formed in said recessed portion of said cover, and said first securing element includes said lip including a recessed portion formed therein for receiving said projection.

14. The enclosure for protecting electronic equipment from electromagnetic interference according to claim 9, further comprising at least one reinforcing element formed on at least one of said plurality of side walls, said at least one reinforcing element is engageable with a first surface of said cover.

15. The enclosure for protecting electronic equipment from electromagnetic interference according to claim 9, wherein said base and said cover are made of materials including Ni coated graphite.

16. The enclosure for protecting electronic equipment from electromagnetic interference according to claim 9, wherein said base and said cover are made of materials including a polymeric material.

17. An enclosure for protecting electronic equipment from electromagnetic interference comprising:
   a base made of an EMI absorbing or reflecting material, said base including a plurality of fastening elements formed on a bottom thereof, a first securing element formed thereon and a recessed portion on an upper surface thereof;
   a cover made of an EMI absorbing or reflecting material, said cover including a second securing element formed thereon for engaging with said first securing element formed on said base, a first narrow end and a second enlarged end; and
   said cover is slidable onto said base by said first narrow end, said second enlarged end being receivable by said recessed portion.

18. An enclosure for protecting electronic equipment from electromagnetic interference comprising:
   a base made of an EMI absorbing or reflecting material, said base including a plurality of fastening elements formed on a bottom thereof and a first securing element formed thereon, said first securing element having a first curvature; and
   a cover made of an EMI absorbing or reflecting material, said cover including a second securing element formed thereon for engaging with said first securing element formed on said base, said second securing element having a second curvature.

19. The enclosure for protecting electronic equipment from electromagnetic interference according to claim 18, wherein said first curvature is less than said second curvature.

20. An enclosure for protecting electronic equipment from electromagnetic interference comprising:
   a base including a plurality of EMI shielding side walls, at least one of said plurality of side walls including a recessed portion on a first surface thereof;
   at least one fastening element formed on at least one of said plurality of side walls;
   an EMI shielding cover, said cover including a first narrow end and a second enlarged end;
   a second securing element formed on said cover for cooperating with a first securing element formed on at least one of said plurality of side walls; and
   said cover is slidable onto said base by said first narrow end, said second enlarged end being receivable by said recessed portion.

21. An enclosure for protecting electronic equipment from electromagnetic interference comprising:
   a base including a plurality of EMI shielding side walls;
   at least one fastening element formed on at least one of said plurality of side walls;
   an EMI shielding cover; and
   a second securing element having a second curvature formed on said cover for cooperating with a first securing element having a first curvature formed on at least one of said plurality of side walls.

22. The enclosure for protecting electronic equipment from electromagnetic interference according to claim 27, wherein said first curvature is less than said second curvature.

* * * * *